United States Patent
Hung

(10) Patent No.: US 6,940,095 B2
(45) Date of Patent: Sep. 6, 2005

(54) METHOD OF FABRICATING THIN FILM TRANSISTOR ARRAY

(75) Inventor: Meng-Yi Hung, Taoyuan Hsien (TW)

(73) Assignee: Quanta Display Inc., Taoyuan (TW)

( * ) Notice: Subject to any disclaimer, the term of this patent is extended or adjusted under 35 U.S.C. 154(b) by 0 days.

(21) Appl. No.: 10/711,628

(22) Filed: Sep. 29, 2004

(65) Prior Publication Data

US 2005/0032282 A1 Feb. 10, 2005

Related U.S. Application Data

(62) Division of application No. 10/249,340, filed on Apr. 2, 2003.

(30) Foreign Application Priority Data

Dec. 3, 2002 (TW) ........................................ 91135000 A

(51) Int. Cl.$^7$ ............................................... H01L 29/04
(52) U.S. Cl. .................... 257/59; 257/347; 257/360; 257/409; 257/529
(58) Field of Search .......................... 257/59, 347, 360, 257/409, 529

Primary Examiner—Long Pham
(74) Attorney, Agent, or Firm—Jianq Chyun IP office

(57) ABSTRACT

A method of fabricating a thin film transistor array is provided. A first patterned conductive layer that distributes over an area range exceeding the designated display region is formed over a substrate. A first dielectric layer is formed over the substrate, wherein the first dielectric layer has the thickness getting smaller toward the edge, so that the first patterned conductive layer outside the designated display region is exposed. A second patterned conductive layer is formed over the first dielectric layer. The second patterned conductive layer and the exposed first patterned conductive layer are electrically connected. A second dielectric layer having a plurality of contact openings therein is formed over the substrate. A plurality of pixel electrodes is formed over the second dielectric layer such that the pixel electrode and the second patterned conductive layer are electrically connected through the contact openings. Finally, various layers outside the designated display regions are removed.

7 Claims, 8 Drawing Sheets

METHOD OF FABRICATING THIN FILM TRANSISTOR ARRAY

CROSS-REFERENCE TO RELATED APPLICATION

This application is a divisional of a prior application Ser. No. 10/249,340, filed Apr. 02, 2003, which claims the priority benefit of Taiwan application serial no. 91135000, filed Dec. 03, 2002.

BACKGROUND OF THE INVENTION

1. Field of Invention

The present invention relates to a method of fabricating the thin film transistor array inside a liquid crystal display (LCD). More particularly, the present invention relates to a method of fabricating a thin film transistor array that minimizes damages due to electrostatic discharge (ESD).

2. Description of Related Art

Liquid crystal display (LCD) has many advantages over a cathode ray tube (CRT) such as a low operating voltage, radiation free, light and occupying a small volume. LCD together with other flat panel type display such as plasma displays and electroluminance displays has become one of the most researched types of displays. At present, active matrix liquid crystal display is often regarded as having the greatest potential to become a next generation product. However, as the number of scan lines is increased, duty cycles assigned by an external driver to each pixel will be reduced. Hence, there will be continuous deterioration of display properties in the display device.

An active array liquid crystal display has a transistor or a diode in each pixel electrode to serve as an active element controlling the writing of data into the liquid crystal display. Currently, thin film transistor liquid crystal display is regarded as the mainstream among other liquid crystal displays. When a pixel electrode is selected (that is, in an 'on' state), signal is written into the pixel. On the other hand, when the pixel electrode is de-selected (that is, in an 'off' state), a storage capacitor within each pixel unit maintains a potential in the liquid crystal layer within the display. Consequently, the liquid crystal and the duty cycle have a static property.

In general, the thin film transistor array within a thin film transistor display is fabricated using a 'five photomask' process as shown in FIGS. 1A to 1E. The photomask process includes operations such as photoresist coating, soft baking, hard baking, photo-exposure, photoresist fixing, chemical development and etching so that various thin films are patterned.

FIGS. 1A to 1E are schematic cross-sectional view showing the steps for fabricating conventional thin film transistor array. As shown in FIG. 1A, a first photomask is used to form a first metallic layer 102 over a substrate 100. The first metallic layer 102 is a patterned metallic layer comprising a gate 102a and a gate connected scan line 102b.

As shown in FIG. 1B, a gate insulating layer 104 is formed over the gates 102a and the scan lines 102b over the substrate 100. Thereafter, a second photomask is used to form a channel layer 106 over the gate insulating layer 104 that crosses over the gate 102a.

As shown in FIG. 1C, a third photomask is used to form a second metallic layer 110 over the substrate 100. The second metallic layer 110 mainly includes a source/drain 110a and a data line 110b with connection to one of the source/drain 110 terminals (the source terminal). In addition, the source/drain 110a are located on each side of the channel layer 106.

As shown in FIG. 1D, a passivation layer 112 is formed over the substrate 100 covering the thin films, that is, the first metallic layer 102, the gate insulating layer 104, the channel layer 106, the second metallic layer 110. A fourth photomask is used to form contact openings 114 in the passivation layer that expose the other terminal (the drain terminal) of the source/drain 110a.

As shown in FIG. 1E, a fifth photomask is used to form a pixel electrode 116 over the passivation layer 112. The pixel electrode 116 may be fabricated using a material such as indium-tin oxide or indium-zinc oxide. Furthermore, the pixel electrode 116 is electrically connected to the other terminal (the drain terminal) of the source/drain 110a through the contact opening 114 in the passivation layer 112.

Aside from forming contact openings 114 in the fourth photomask step, openings 115a and 115b are also formed in the gate insulating layer 104 and the passivation layer 112 close to the edge of the substrate 100 as shown in FIG. 1F. FIG. 1F is a cross-section through a peripheral area of FIG. 1E. The openings 115a and 115b expose the first metallic layer 102 and the second metallic layer 110. The first metallic layer 102 and the second metallic layer 110 are electrically connected through the pixel electrode 116 only after the fifth photomask step is completed. In other words, before conductive the fourth photomask step, the first metallic layer 102 and the second metallic layer 110 are isolated from each other. Hence, the probability of having an electrostatic discharge (ESD) between the two metallic layers is rather high.

One method to reduce possible damages due to an ESD between the two metallic layers includes conducting one more photomask step to pattern the gate insulating layer. The patterned gate insulating layer has a short ring opening that exposes the first metallic layer electrically. The short ring opening permits an electrical connection of the subsequently formed second metallic layer with the underlying first metallic layer. However, this will increase the number of photomask step by one and hence add processing complexity as well as production cost.

SUMMARY OF THE INVENTION

Accordingly, one object of the present invention is to provide a method of fabricating a thin film transistor array capable of preventing damage due to an electrostatic discharge between a first metallic layer and a second metallic layer prior to the formation of a pixel electrode in a conventional process.

A second object of this invention is to provide a method of fabricating thin film transistor capable of preventing damage due to an electrostatic discharge between a first metallic layer and a second metallic layer without increasing processing steps or production cost.

To achieve these and other advantages and in accordance with the purpose of the invention, as embodied and broadly described herein, the invention provides a method of fabricating a thin film transistor array. The method is suitable for fabricating a thin film transistor array on a substrate having at least one designated display region. The method includes forming a first patterned conductive layer over the substrate. The first patterned conductive layer distributes over an area range exceeding the designated display region. Thereafter, a first dielectric layer is formed over the substrate. Through the first dielectric layer, the patterned conductive layer outside the designated display region is exposed. A second patterned conductive layer is formed over the first dielectric layer. The second patterned conductive layer and the exposed first patterned conductive layer are electrically connected. A second dielectric layer is formed over the substrate. The second dielectric layer has a plurality of contact openings. A plurality of pixel electrodes is formed over the second dielectric layer such that the pixel electrode and the second patterned conductive layer are electrically connected through the contact openings. Finally, the second dielectric layer, the second patterned conductive layer, the first dielectric layer and the first patterned conductive layer outside the designated display region are removed.

This invention also provides a method of eliminating damages caused by electrostatic discharge that can be applied to the fabrication of a thin film transistor array on a designated display region. The thin film transistor array includes a first patterned conductive layer having an area distribution range exceeding the designated display region and including a plurality of gates and a plurality of gate connected scan lines, a second patterned conductive layer over the first patterned conductive layer having a plurality of source/drain terminals and source/drain terminal (source terminal) connected data lines, a pixel electrode between the first patterned conductive layer and the second patterned conductive layer and a pixel electrode connected to the source/drain terminal (the drain terminal). One major aspect of this invention is that in the process of forming the first dielectric layer, the first dielectric layer covers the gates and the scan lines inside the designated display region but exposes the first patterned conductive layer outside the designated display region. Thereafter, in the process of forming the second patterned conductive layer over the first patterned conductive layer, the second patterned conductive layer and the exposes first patterned conductive layer are electrically connected.

The step of forming the first dielectric layer includes using a chemical vapor deposition and controlling the processing parameters such that the first dielectric layer only covers the gates and the scan lines inside the designated display region but exposes the first patterned conductive layer outside the designated display region. The first dielectric layer has a thickness getting smaller toward the edge.

This invention also provides a thin film transistor array semi-finished product structure suitable for forming on a substrate having at least one designated display region. The semi-finished product structure includes a first patterned conductive layer, a dielectric layer and a second patterned conductive layer. The first patterned conductive layer is positioned over the substrate and distributed over an area range exceeding the designed display region. The dielectric layer covers a portion of the first patterned conductive layer but exposes the first patterned conductive layer outside the designated display region. The second patterned conductive layer is positioned over the dielectric layer. The second patterned conductive layer and the exposed first patterned conductive layer are electrically connected.

In this invention, the second patterned conductive layer and the first patterned conductive layer are electrically connected before forming the source/drain terminals and the data lines. Hence, probability of having a damaging electrostatic discharge before the fabrication of the pixel electrode is greatly minimized. Furthermore, this invention need no additional photomask step and hence able to avoid possible damage to the thin film transistor device caused by an electrostatic discharge between the electrically isolated first and second metallic layer in a conventional fabrication process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
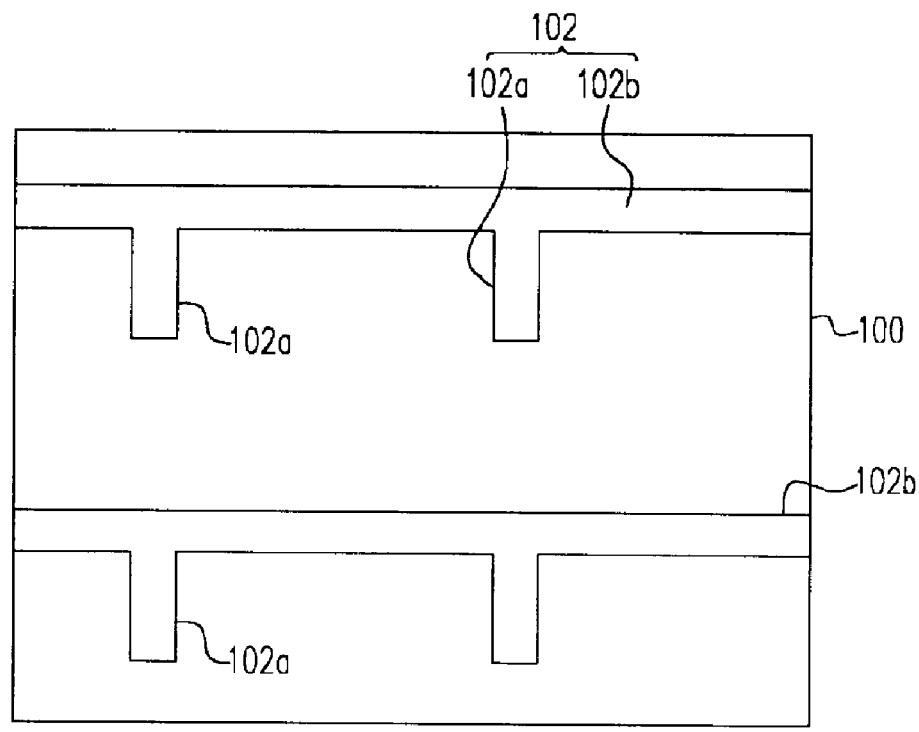
FIGS. 1A to 1E are schematic cross-sectional view showing the steps for fabricating conventional thin film transistor array.
Figure 1B:
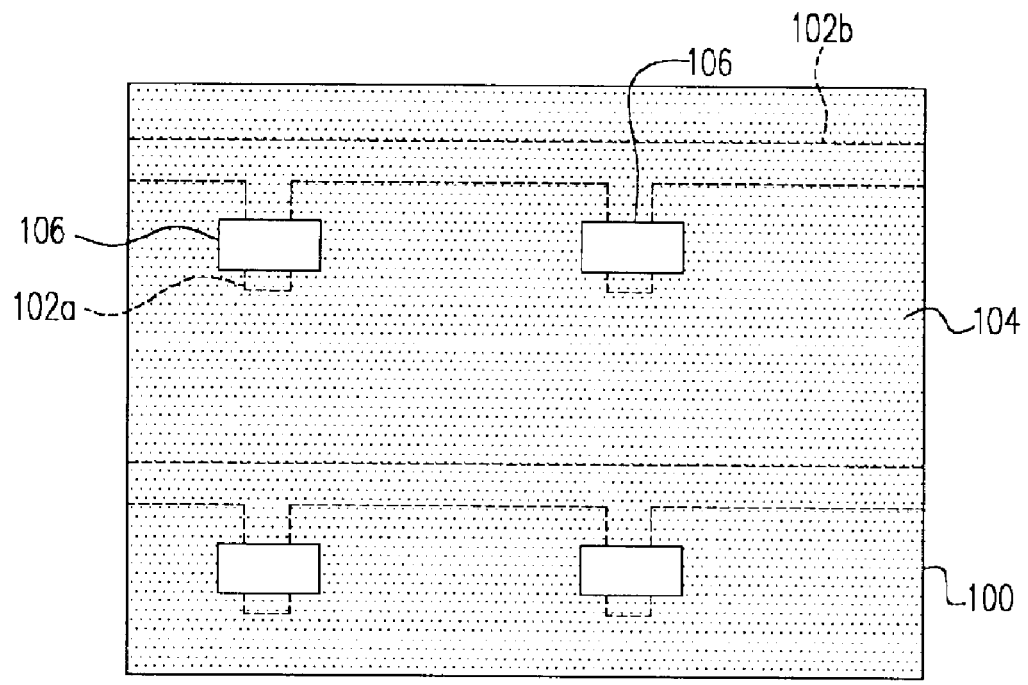
Figure 1C:
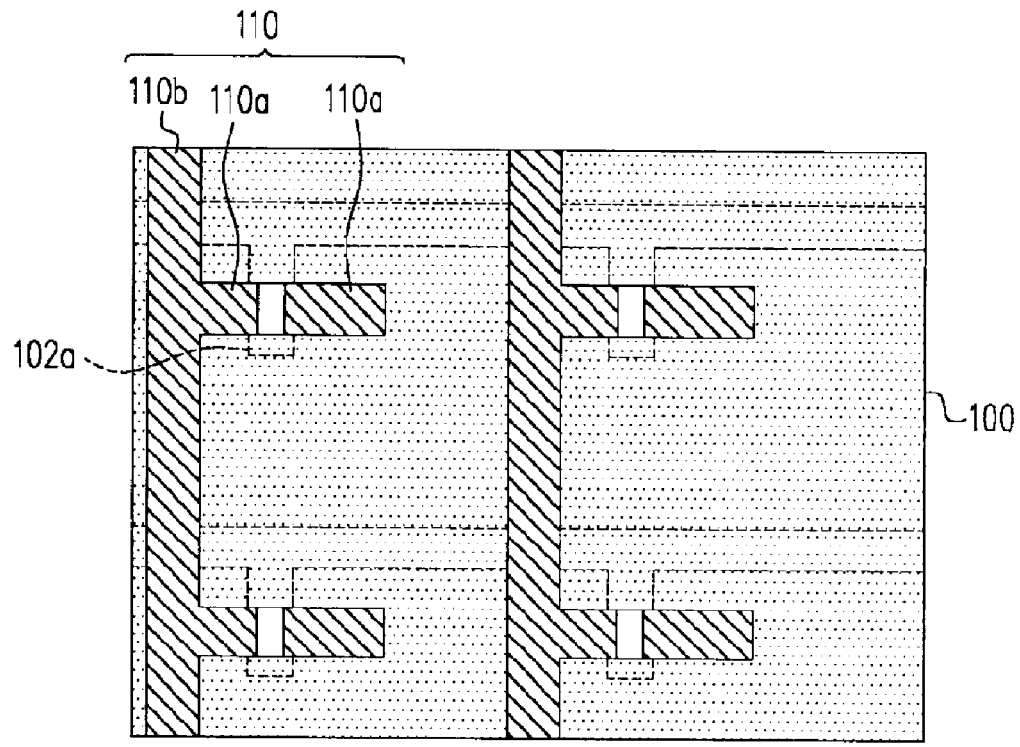
Figure 1D:
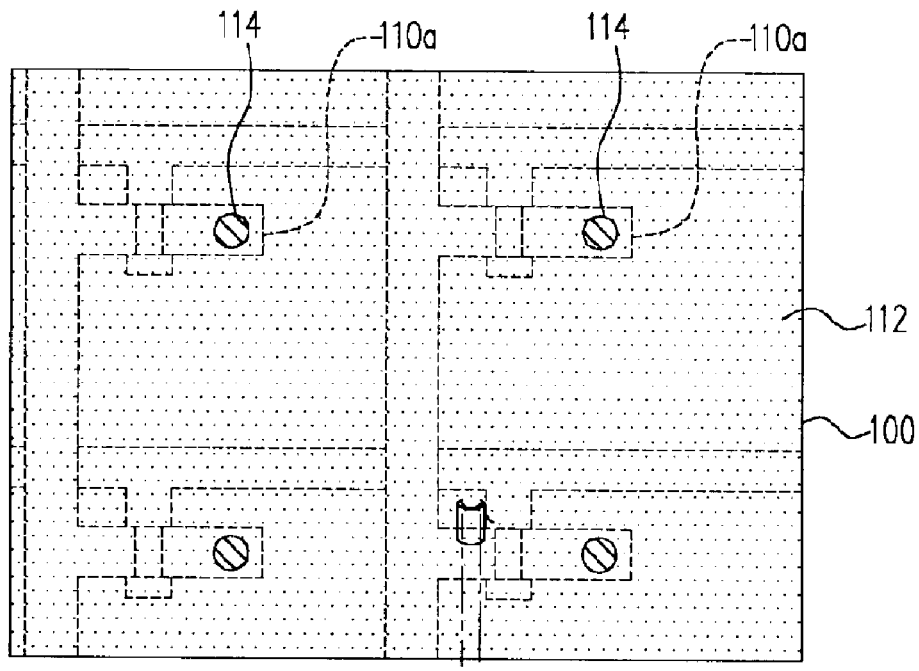
Figure 1E:
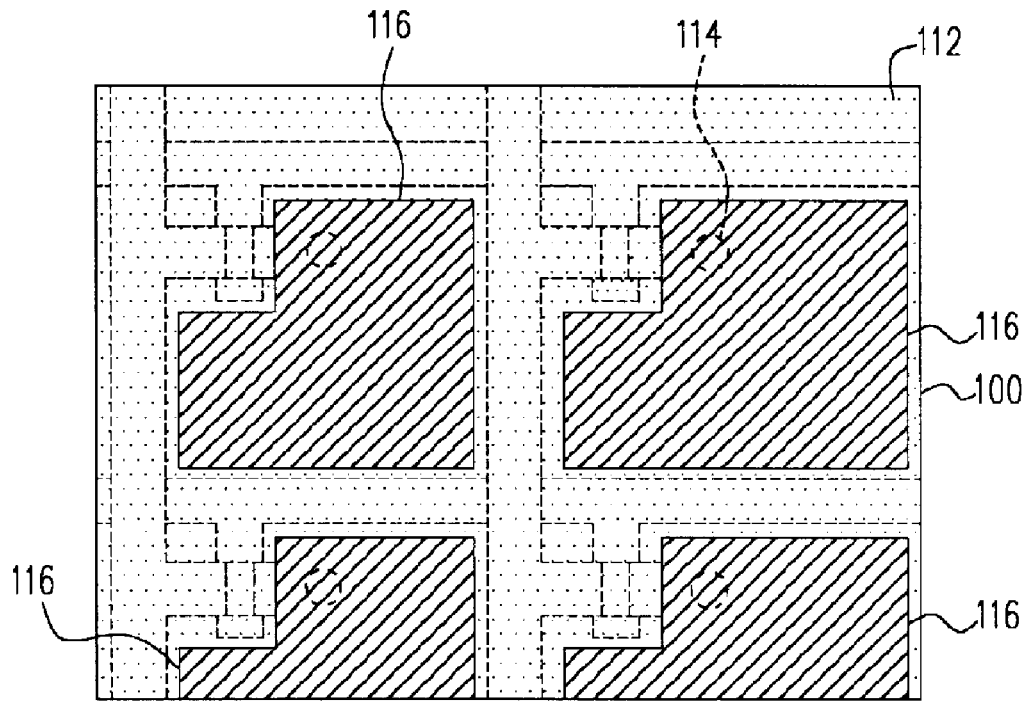
Figure 1F:
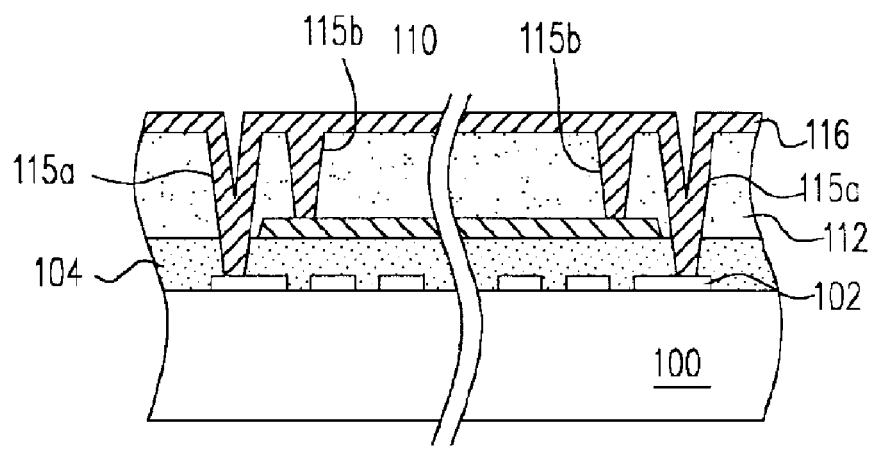
FIG. 1F is a cross-section through a peripheral area of FIG. 1E.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
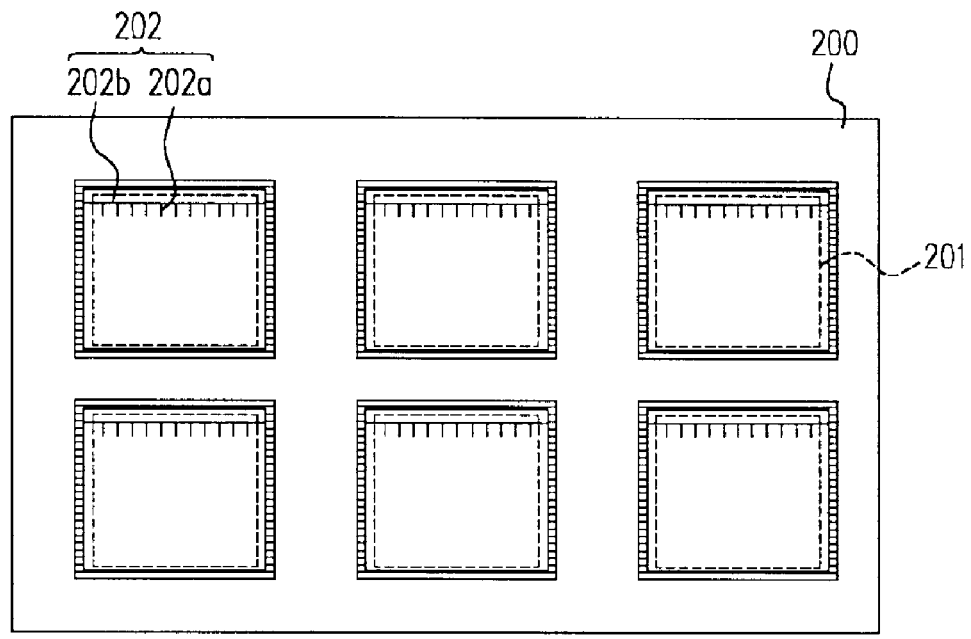
FIGS. 2A to 2C are top views showing the front-end fabrication process of a thin film transistor array according to one preferred embodiment of this invention.
Figure 2B:
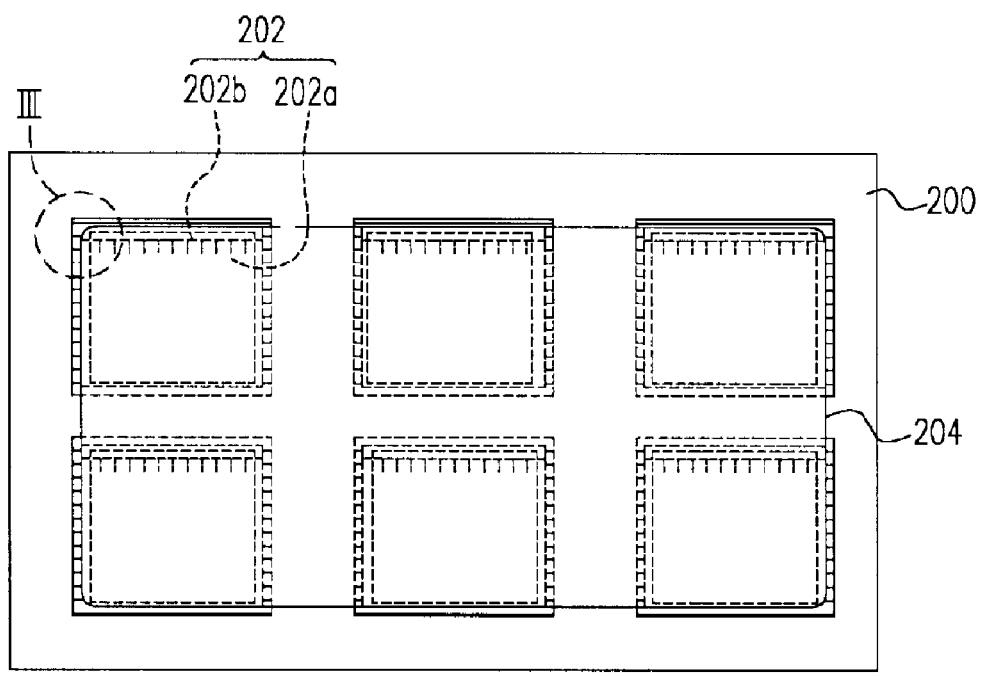
Figure 2C:
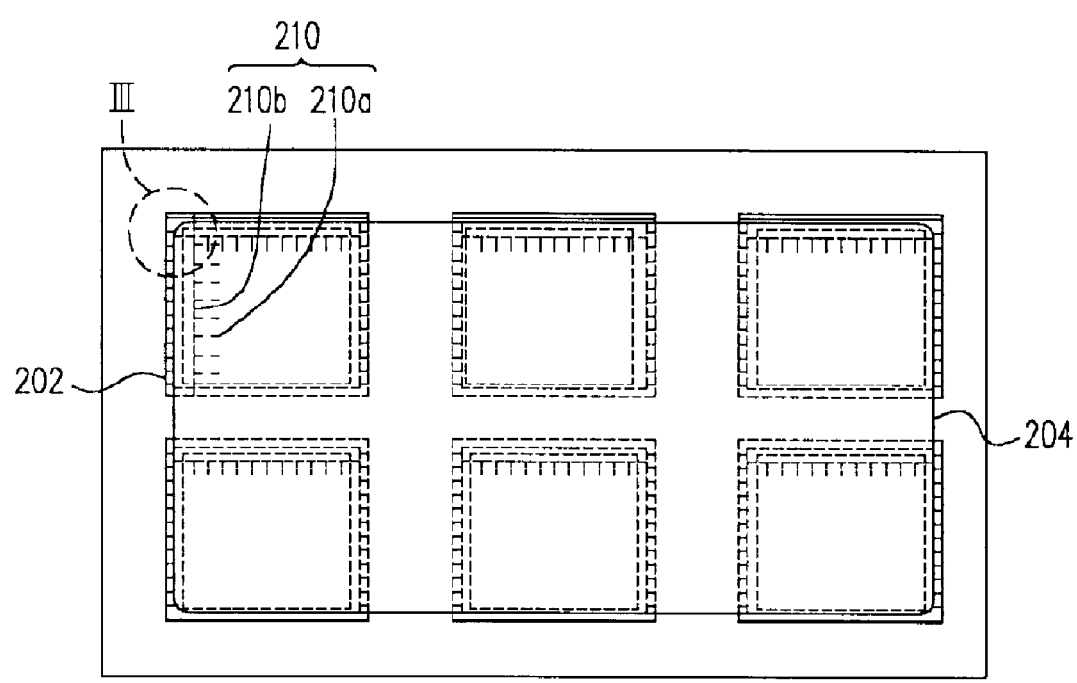

FIGS. 2A to 2C are top views showing the front-end fabrication process of a thin film transistor array according to one preferred embodiment of this invention. As shown in FIG. 2A a substrate 200 having a plurality of designated display regions 201 is provided. In this embodiment, the designated display regions refer to the areas on the substrate 200 for forming display panels. Here, although six display regions 201 are shown, the number of display regions on a substrate 200 is unrestricted. Thereafter, a first patterned conductive layer 202 is formed over the substrate 200. The first patterned conductive layer 202 distributes over an area range that exceeds the display regions 201. The first patterned conductive layer 202 includes a plurality of gates 202a and a plurality of gate connected scan lines 202b. The process of forming the first patterned conductive layer 202 includes depositing conductive material over the substrate 200 to form a first conductive layer (not shown) and then conducting photolithographic and etching process to pattern the first conductive layer. The first conductive layer is formed, for example, by sputtering a metallic material such as chromium or tantalum. To simplify the figure, only one of the scan lines 202b and one of the gates 202a over the scan lines 202b is shown inside each designated display region 201. In practice, however, each designated display region 201 should include more than one scan line 202b.

As shown in FIG. 2B, a first dielectric layer 204 is formed over the substrate 200 to serve as a gate insulating layer. The first dielectric layer 204 covers the gates 202a and the scan lines 202b inside the designated display regions 201 but exposes the first patterned conductive layer 202 outside the designated display region 201. The first dielectric layer 204 is formed, for example, by plasma enhanced chemical vapor deposition (PECVD) with suitable deposition parameters such that the first dielectric layer 204 covers the gate 202a and the scan line 202b inside the designated display region 201 only. Wherein, the first dielectric layer 204 has a thickness getting smaller toward the edge. The first dielectric layer is fabricated using a material such as silicon nitride (SiNx).

Figure 3A:
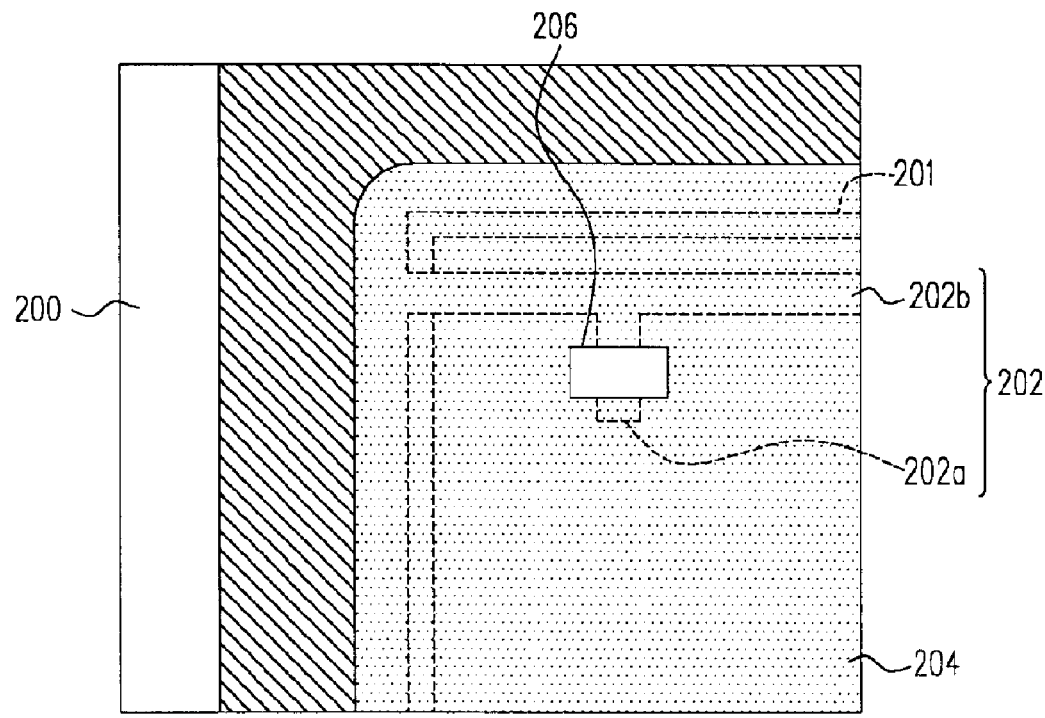
FIG. 3A is a magnified view of section III in FIG. 2B.

Thereafter, a channel layer is formed over the substrate 200 crossing over the gate 202a. FIG. 3A is a magnified view of section III in FIG. 2B. As shown in FIG. 3A, the first dielectric layer 204 covers the gate 202a and the scan line 202b inside the designated display region 201 and exposes the first patterned conductive layer 202 outside the designated display region 201. The channel layer 206 over the substrate 200 crosses over the gate 202a. The channel layer 206 can be a channel amorphous silicon layer. After forming the channel layer 206, an ohmic contact layer (not shown) may form over the channel layer 206 selectively. The ohmic contact layer is a n+ amorphous silicon film, for example.

As shown in FIG. 2C, a second patterned conductive layer 210 is formed over the substrate 200. The second patterned conductive layer 210 is formed, for example, by depositing conduct material over the substrate 200 to form a second conductive layer (not shown) and then conducting photolithographic and etching processes to pattern the second conductive layer into source/drain terminals 210a and data lines 210b. The second conductive layer is formed, for example, by sputtering a metallic material such as aluminum. Since the second patterned conductive layer 210 and the first patterned conductive layer 202 are electrically connected, possible damage due to an electrostatic discharge before forming the pixel electrode in a conventional method can be avoided.

Figure 3B:
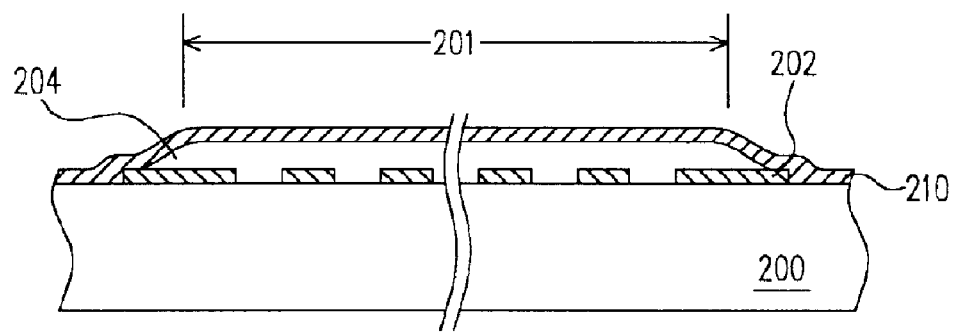
FIG. 3B is a simplified sectional view of FIG. 2C.
Figure 3C:
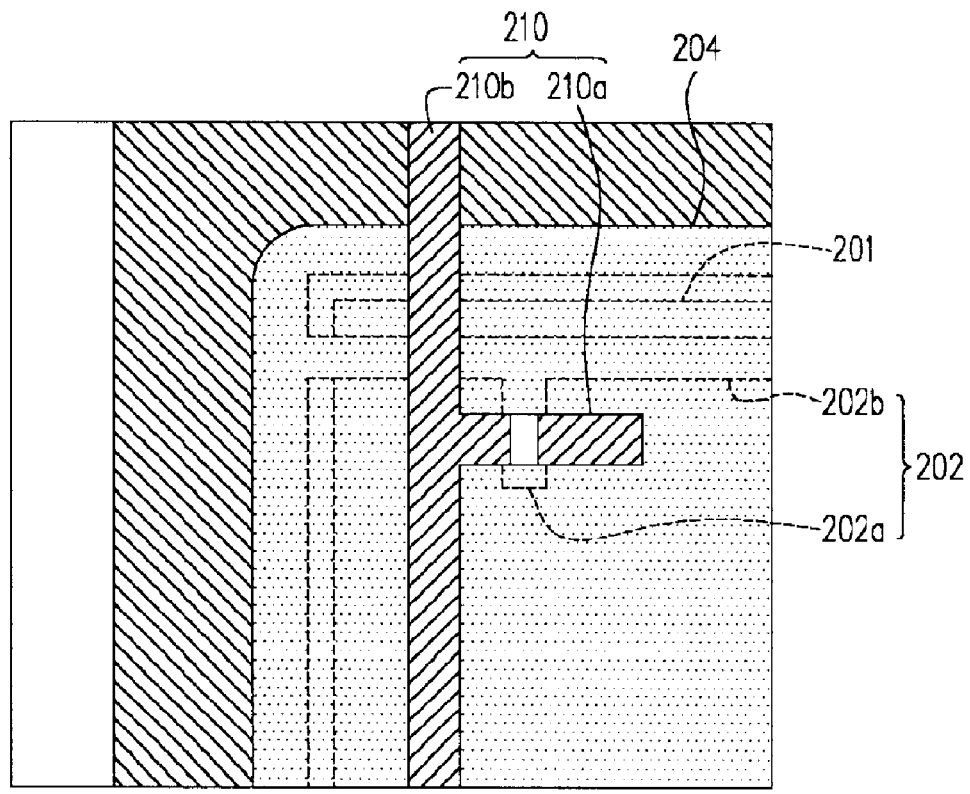
FIG. 3C is a magnified view of section III' in FIG. 2C.

To describe more fully the relative position between various films including the first patterned conductive layer 202, the first dielectric layer 204 and the second patterned conductive layer 210, refer to FIGS. 3B and 3C. FIG. 3B is a simplified sectional view of FIG. 2C and FIG. 3C is a magnified view of section III' in FIG. 2C. As shown in FIG. 3B, the first patterned conductive layer 202 and the second patterned conductive layer 210 on the substrate 200 are connected through area outside the designated display region 201. However, inside the designated display region 201, the first dielectric layer 204 isolated the two.

As shown in FIG. 3C, the second patterned conductive layer 210 including the source/drain terminal 210a and the data line 210b inside the designated display region 201 and the underlying first patterned conductive layer 202 including the gate 202a and the scan line 202b are separated from each other. However, the first patterned conductive layer 202 and the second patterned conductive layer are electrically connected outside the designated display region 201.

Figure 3D:
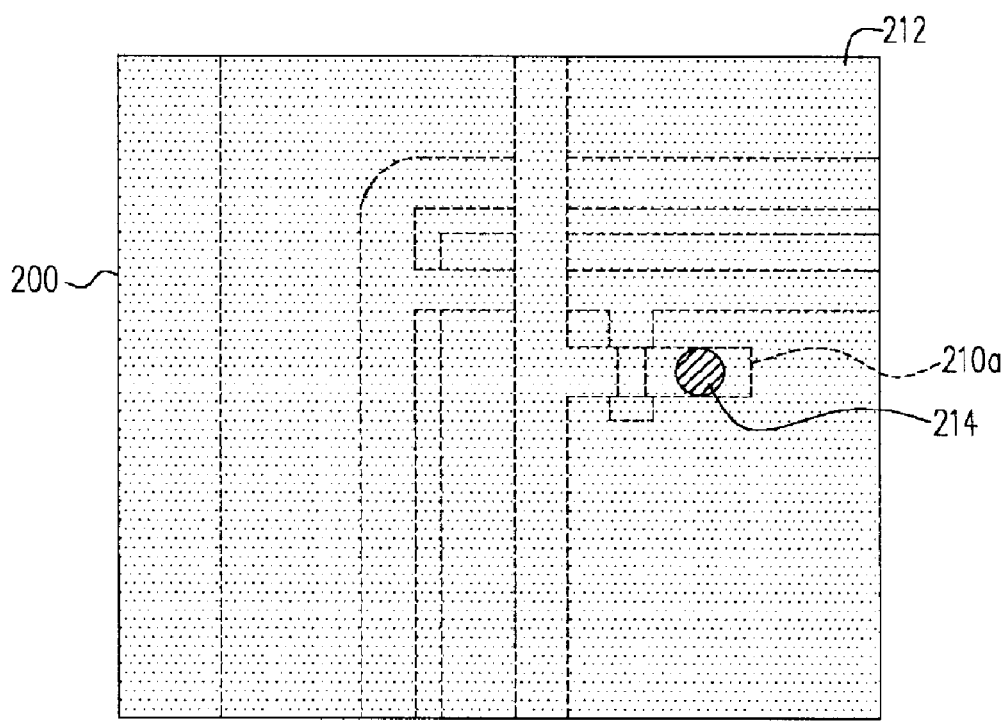
FIGS. 3D and 3E are top views showing the steps carried out after fabricating the thin film transistor array structure as shown in FIG. 3B.
Figure 3E:
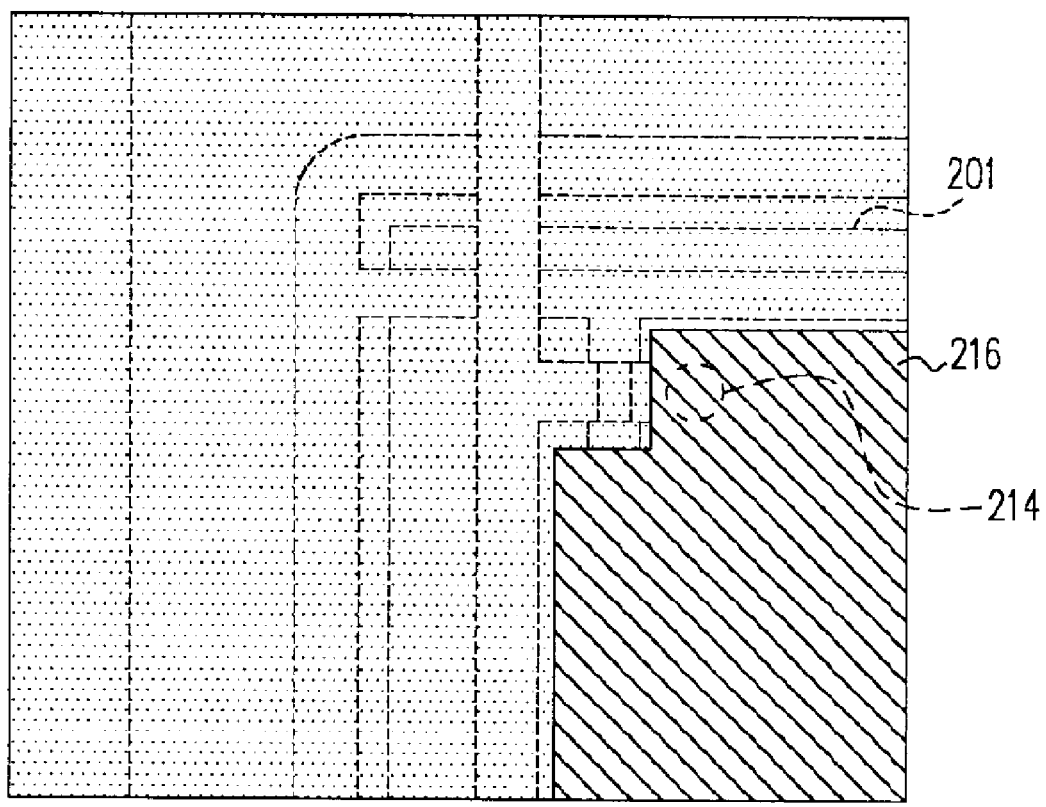

After forming the source/drain terminal 210a and the data line 210b, FIGS. 3D and 3E show the subsequent steps for fabricating the thin film transistor array after the step in FIG. 3C.

As shown in FIG. 3D, a second dielectric layer 212 serving as a passivation layer is formed over the substrate 200 covering the aforementioned device. The second dielectric layer 212 has a plurality of contact openings 214 that exposes the other terminal (the drain terminal) of the source/drain terminal 210a. The second dielectric layer 212 is fabricated using a dielectric material, for example.

As shown in FIG. 3D, a pixel electrode 216 is formed inside the designated display region 201 filling the contact openings 214 in the second dielectric layer 212. The pixel electrode 216 is an indium-tin oxide film, for example. After the aforementioned process, an etching operation is carried out to remove the second dielectric layer 212, the second patterned conductive layer 210, the first dielectric layer 204 and the first patterned conductive layer 202 outside the designated display region 201.

One major characteristic of this invention is that the second patterned conductive layer and the first patterned conductive layer are electrically connected to prevent electrostatic discharge before forming the pixel electrode. Furthermore, this invention need no additional photomask step and hence able to avoid possible damage to the thin film transistor device caused by an electrostatic discharge between the electrically isolated first and second metallic layer in a conventional fabrication process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A thin film transistor array semi-finished product structure over a substrate having at least one designated display region, comprising:

a first patterned conductive layer over the substrate, wherein the first patterned conductive layer distributes over an area range that exceeds the designated display region;

a dielectric layer covering a portion of the first patterned conductive layer but exposing the first patterned conductive layer outside the designated display region; and a second patterned conductive layer over the dielectric layer, wherein the second patterned conductive layer and the exposed first patterned conductive layer are electrically connected.

2. The structure of claim 1, wherein the first patterned conductive layer includes a plurality of gates and a plurality of gate connected scan lines.

3. The structure of claim 1, wherein material constituting the first patterned conductive layer includes a metallic substance.

4. The structure of claim 3, wherein material constituting the first patterned conductive layer is selected from a group consisting of chromium and tantalum.

5. The structure of claim 1, wherein material constituting the dielectric layer includes silicon nitride.

6. The structure of claim 1, wherein material constituting the second patterned conductive layer includes a metallic substance.

7. The structure of claim 6, wherein material constituting the second patterned conductive layer includes aluminum.

* * * * *